US007183039B2

(12) United States Patent
Timpe et al.

(10) Patent No.: US 7,183,039 B2
(45) Date of Patent: Feb. 27, 2007

(54) 1,4-DIHYDROPYRIDINE-CONTAINING IR-SENSITIVE COMPOSITION AND USE THEREOF FOR THE PRODUCTION OF IMAGEABLE ELEMENTS

(75) Inventors: Hans-joachim Timpe, Osterode/Harz (DE); Tobias Wittig, Osterode (DE); Jianbing Huang, Trumbull, CT (US); Ursula Muller, Herzberg am Harz (DE)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/559,230

(22) PCT Filed: Jun. 8, 2004

(86) PCT No.: PCT/EP2004/006184

§ 371 (c)(1),
(2), (4) Date: Dec. 6, 2005

(87) PCT Pub. No.: WO2005/001571

PCT Pub. Date: Jan. 6, 2005

(65) Prior Publication Data

US 2006/0154172 A1 Jul. 13, 2006

(30) Foreign Application Priority Data

Jun. 11, 2003 (DE) ................................ 103 26 326

(51) Int. Cl.
*G03F 7/029* (2006.01)
*G03F 7/031* (2006.01)
*G03F 7/14* (2006.01)

(52) U.S. Cl. ................................ 430/278.1; 430/281.1; 430/286.1; 430/302; 430/325; 430/916; 430/920

(58) Field of Classification Search ............. 430/278.1, 430/281.1, 286.1, 302, 325, 916, 920
See application file for complete search history.

(56) References Cited

U.S. PATENT DOCUMENTS

| | | | | |
|---|---|---|---|---|
| 6,143,471 | A | 11/2000 | Takata et al. | |
| 6,291,143 | B1 * | 9/2001 | Patel et al. | 430/339 |
| 6,309,792 | B1 | 10/2001 | Hauck et al. | |

FOREIGN PATENT DOCUMENTS

| | | |
|---|---|---|
| DE | 287 796 | 10/1983 |
| DE | 199 10 363 | 3/1999 |
| EP | 1 079 972 | 11/2003 |

* cited by examiner

*Primary Examiner*—Richard L. Schilling
(74) *Attorney, Agent, or Firm*—J. Lanny Tucker

(57) ABSTRACT

Initiator system comprising:
(a) at least one substance capable of absorbing IR radiation,
(b) at least one compound capable of forming free radicals, and
(c) at least one 1,4-dihydropyridine derivative of the formula (I)

(I)

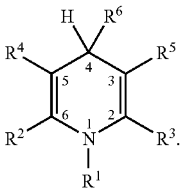

18 Claims, No Drawings

1,4-DIHYDROPYRIDINE-CONTAINING IR-SENSITIVE COMPOSITION AND USE THEREOF FOR THE PRODUCTION OF IMAGEABLE ELEMENTS

The present invention relates to IR-sensitive compositions which are, inter alia, excellently suited for the production of elements imageable by means of IR radiation. In particular, the invention relates to IR-sensitive compositions containing a 1,4-dihydropyridine. The invention furthermore relates to negative working imageable elements based thereon, a process for the production of such elements, a process for imaging such elements, as well as to an imaged element such as e.g. a lithographic printing form.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to electromagnetic radiation such that the exposed portion becomes so soluble that it is removed during the developing process. Such a plate is referred to as positive working. On the other hand, a plate is referred to as negative working if the exposed portion of the coating is hardened by the radiation and thus rendered insoluble in the developer. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. Alternatively, the plate can also be exposed digitally without a film, e.g. with a UV laser. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Nowadays, radiation-sensitive compositions that can in particular be used in high-capacity printing plates have to fulfill high standards.

There are essentially two ways to improve the properties of radiation-sensitive compositions and thus the corresponding printing plates. One way deals with the improvement of the properties of the radiation-sensitive components in the compositions (often negative diazo resins or photoinitiators), while the other way aims at finding new polymeric compounds ("binders") that are intended to control the physical properties of the radiation-sensitive layers. The first way is of the utmost importance for printing plates if their sensitivity is to be adjusted to certain ranges of electromagnetic radiation. However, the nature of such initiator systems also strongly affects the storage stability and radiation sensitivity of the materials.

Latest developments in the field of printing plates deal with radiation-sensitive compositions that can be imaged by means of lasers or laser diodes. This imaging method renders the use of films as intermediate carriers of information unnecessary since lasers or laser diodes can be controlled via computers.

High-performance lasers or laser diodes used in commercially available image-setters emit light in the wavelength ranges of 800 to 850 nm or 1060 and 1120 nm. Printing plates and initiator systems contained therein which have to be suitable to be image-wise exposed (to be "imageable") by means of such image-setters therefore have to exhibit sensitivity in the near IR range.

Negative working plates that can be imaged by means of IR lasers are for example known from EP-A-0 672 544, EP-A-0 672 954 and U.S. Pat. No. 5,491,046 as well as EP-A-0 819 985.

U.S. Pat. No. 4,181,531 and U.S. Pat. No. 4,271,260 describe positive working systems containing 1,4-dihydropyridine derivatives and exhibiting sensitivity to UV light. However, such systems cannot withstand the chemicals specifically used during printing (such as e.g. solvents) so that only low numbers of copies can be obtained using such systems.

Negative working systems containing 1,4-dihydropyridines are described in DD-A-287 796. The photopolymerizable compositions disclosed in this document comprise an onium compound as coinitiator and are only sensitive in the UV range. Furthermore, the sensitivity obtained with these systems cannot by far meet the requirements of today's printing plates.

The use of 1,4-dihydropyridines in radiation-sensitive systems is also known from U.S. Pat. No. 6,143,471. In this document, 1,4-dihydropyridines are used as solvent inhibitors for polymers in positive working IR-sensitive compositions.

In U.S. Pat. No. 6,291,143 1,4-dihydropyridines are used as photoreduction agents for dyes (such as IR dyes) in laser thermo-transfer systems. The resulting pyridinium salts furthermore function as cross-linking agents for hydroxy-functionalized resins in this system.

At this time, radiation-sensitive compositions which show both a high degree of radiation sensitivity and sufficient storage stability when used in the production of printing plates are only known with UV-absorbing dyes (EP-A-0 730 201). However, printing plates with such compositions have to be produced and processed under dark-room conditions and cannot be imaged by means of the above-mentioned lasers or laser diodes. The fact that they cannot be processed under daylight conditions in particular limits their usability.

It is the object of the present invention to provide IR-sensitive compositions for the production of negative printing plates with a high degree of storage stability which yield a large number of copies on the printing machine and are furthermore characterized by a high IR sensitivity.

Another object of the present invention is the use of such IR-sensitive compositions for the production of negative working printing plates.

These objects are achieved by an IR-sensitive composition comprising, in addition to a polymeric binder, a free-radical polymerizable system comprising unsaturated free-radical polymerizable monomers or prepolymers and an initiator system, said initiator system comprising the following components:

(a) at least one substance capable of absorbing IR radiation, (b) at least one compound capable of forming free radicals, and (c) at least one 1,4-dihydropyridine derivative of the formula (I)

(I)

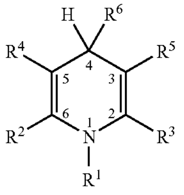

wherein $R^1$ is selected from a hydrogen atom, —C(O)OR$^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)OR$^7$, —C(O)R$^7$, —C(O)NR$^8$R$^9$ and CN, or $R^2$ and $R^4$ together form an optionally substituted phenyl ring or a 5- to 7-membered carbocyclic or heterocyclic ring, wherein the unit

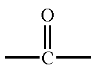

is present in the carbocyclic or heterocyclic ring adjacent to position 5 of the 1,4-dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

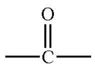

is present in the carbocyclic or heterocyclic rings adjacent to positions 3 and 5 of the dihydropyridine ring and wherein the carbocyclic or heterocyclic rings optionally comprise additional substituents, or one of the pairs $R^2$/$R^4$ and $R^3$/$R^5$ forms a 5- to 7-membered carbocyclic or heterocyclic ring, wherein the unit

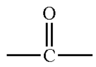

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —NR$^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

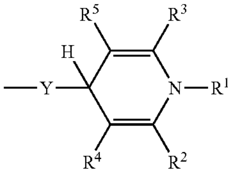

Y is an alkylene group or an arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

Unless defined otherwise, the term "alkyl group" as used in the present invention refers to a straight-chain, branched or cyclic saturated hydrocarbon group which preferably comprises 1 to 18 carbon atoms, more preferably 1 to 10 carbon atoms and especially preferred 1 to 6 carbon atoms. The alkyl group can optionally comprise one or more substituents (preferably 0 or 1 substituent) selected for example from halogen atoms (fluorine, chlorine, bromine, iodine), CN, $NR^{13}_2$, $COOR^{13}$ and $OR^{13}$ (each $R^{13}$ independently represents a hydrogen atom, an alkyl group, aryl group or aralkyl group). The above definition also applies to the alkyl unit of an aralkyl group and an alkylene group.

Unless defined otherwise, the term "aryl group" as used in the present invention refers to an aromatic carbocyclic group with one or more fused rings, which preferably comprises 6 to 14 carbon atoms. The aryl group can optionally comprise one or more substituents (preferably 0 to 3) selected for example from halogen atoms, alkyl groups, alkoxy groups, CN, $NR^{13}_2$, $SO_3H$, $COOR^{13}$ and $OR^{13}$ (wherein each $R^{13}$ is independently selected from hydrogen, alkyl, aryl and aralkyl). The above definition also applies to the aryl unit of an aralkyl group and an arylene group. Preferred examples are a phenyl group and a naphthyl group, which can optionally be substituted.

Unless defined otherwise, the term "heterocyclic group" as used in the present invention refers to a 5- to 7-membered (preferably 5- or 6-membered) saturated, unsaturated (non-aromatic) or aromatic ring, wherein one or more ring carbon atoms are replaced with heteroatoms selected from N, $NR^{13}$, S and O (preferably N or $NR^{13}$). The heterocyclic ring can optionally comprise one or more substituents, selected for example from alkyl groups, aryl groups, aralkyl groups, halogen atoms, $—OR^{13}$, $—NR^{13}_2$, $—C(O)OR^{13}$, $C(O)NR^{13}_2$ and CN (wherein each $R^{13}$ is independently selected from hydrogen, alkyl, aryl and aralkyl). It goes without saying that due to the given basic structures (I) and (Ia) to (Ig), not every heterocyclic ring can be saturated or unsaturated or aromatic.

As referred to in the present invention, a fused ring or ring system indicates a ring that shares two atoms with the ring to which it is fused.

As referred to in the present invention, a carbocyclic ring is a 5- to 7-membered (preferably 5- or 6-membered) saturated or unsaturated ring. The carbocyclic ring can optionally comprise one or more substituents, selected for example from alkyl groups, aryl groups, aralkyl groups, halogen atoms, CN, $—NR^{13}_2$, $—C(O)OR^{13}$, $—C(O)NR^{13}_2$ and $—OR^{13}$ (wherein $R^{13}$ is as defined above). It goes without saying that due to the given basic structures (I) and (Ia) to (Ig), not every carbocyclic ring can be unsaturated or saturated.

In the free-radical polymerizable system used in the present invention, the formation of free radicals takes place due to the interaction of the IR absorber, the radical former and the 1,4-dihydropyridine derivative of formula (I). The presence of all three components is necessary for achieving a high degree of radiation sensitivity. It was found that the absence of a radical former led to compositions that showed no radiation sensitivity whatsoever.

Basically all polymers or polymer mixtures known in the art can be used as polymeric binders for the IR-sensitive composition. Linear organic polymers soluble or swellable in water or aqueous alkaline solutions are especially suitable. Suitable binders are described for example in EP-A-1 170 123. Acrylic acid copolymers, methacrylic acid copolymers, itaconic acid copolymers, crotonic acid copolymers, maleic acid copolymers, partially esterified copolymers of maleic acid and acidic cellulose derivatives are particularly suitable. Preferably, the polymers have a weight-average molecular weight in the range of 10,000 to 1,000,000 (determined by means of GPC). In view of possible problems occurring in connection with ink acceptance during the printing process, it is preferred that the used polymer have an acid number of >40 mg KOH/g, or, when polymer mixtures are used, that the arithmetic average of the individual acid numbers be >40 mg KOH/g. A polymer or polymer mixture with an acid number of >70 mg KOH/g is preferred; especially preferred is an acid number between 110 and 140 mg KOH/g.

However, polymers without an acid number can be used as well if specific functional groups, such as e.g. polyether functions as side chains, ensure sufficient developability in aqueous and aqueous alkaline solutions. Especially suitable binders are furthermore those comprising at least one C—C double bond in the main chain or in a side chain of the polymer molecule. Such polymers are for example described in EP-A 1 091 247, EP-A 1 170 123, EP-A 1 285 751 and US-A1 2001/0018164.

The content of the polymeric binder in the IR-sensitive composition preferably accounts for 30 to 60 wt.-%, more preferably 35 to 45 wt.-%, based on the total solids content of the IR-sensitive composition. In the framework of the present invention, the total solids content of the IR-sensitive composition is equated with the dry layer weight of the IR-sensitive layer produced therefrom.

The free-radical polymerizable system of the present invention comprises at least one compound comprising at least one, preferably two, terminal C—C double bonds. Such compounds are known to the person skilled in the art, and each of those compounds can be used in the present case without any restrictions. They may be present in solid or liquid form, with solid and highly viscous forms being preferred. Both individual monomers and prepolymers (e.g. dimers, trimers, oligomers) and mixtures thereof, as well as polymers comprising one, preferably several, terminal C—C double bonds, can be used.

Acrylic acid, methacrylic acid, itaconic acid, crotonic acid or maleic acid derivatives with one or more unsaturated groups, preferably esters or amides of acrylic or methacrylic acid, can e.g. be used as unsaturated free-radical polymerizable monomers or prepolymers. However, adducts of those esters or amides comprising substituents such as hydroxyl, amino or mercapto groups, with monofunctional or polyfunctional isocyanates or epoxides can be used as well. Furthermore, derivatives of unsaturated phosphonic acids or substituted styrenes can be used.

Compounds suitable as monomers include for instance ethylene glycol diacrylate and -methacrylate, trimethylol propane triacrylate and -methacrylate, pentaerythritol triacrylate and -methacrylate, dipentaerythritolmono hydroxy pentaacrylate and -methacrylate, dipentaerythritol hexaacrylate and -methacrylate, pentaerythritol tetraacrylate and -methacrylate, ditrimethylol propane tetraacrylate and -methacrylate, diethylene glycol diacrylate and -methacrylate, triethylene glycol diacrylate and -methacrylate or tetraethylene glycol diacrylate and -methacrylate, sorbitol tetraacrylate and -methacrylate, bis[p-(3-methacryloxy-2-hydroxypropyl)phenyl]di-methylmethane, 1,3-butanediol diltaconate, triethylene glycol dimaleate, tetraethylene glycol dicrotonate and 1,6-hexamethylene bisacrylamide. Further suitable prepolymers or polymers are urethane acrylates and methacrylates, epoxide acrylates and methacrylates, polyester acrylates and methacrylates, polyether acrylates and methacrylates or unsaturated polyester resins.

The free-radical polymerizable monomers or prepolymers are preferably present in an amount of 35 to 70 wt.-%, especially preferred 45 to 60 wt.-%, based on the total solids content of the IR-sensitive composition. The type and amount of the monomers or prepolymers used determine in particular the IR sensitivity and the printing behavior of the IR-sensitive composition. Suitable IR-absorbing compounds typically exhibit an absorption maximum in the range of 750 nm to 1,300 nm of the electromagnetic spectrum. Preferably, the absorption maximum is in the range of 800 to 1,100 nm. Preferably, the IR-absorbing compound is selected from triarylamine dyes, thiazolium dyes, indolium dyes, oxazolium dyes, cyanine dyes, polyaniline dyes, polypyrrol dyes, polythiophene dyes and phthalocyanine pigments; cyanine dyes being especially preferred. Such IR-absorbing compounds are described e.g. in U.S. Pat. No. 4,327,169, U.S. Pat. No. 4,756,993 and U.S. Pat. No. 5,156,938.

According to one embodiment, a cyanine dye of the formula (II)

(II)

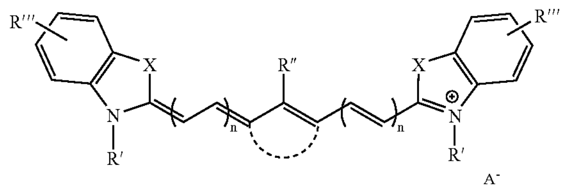

is used, wherein each X independently represents S, O, NR or C(alkyl)$_2$;

each R' independently represents an alkyl group, an alkylsulfonate group or an alkylammonium group;

R" represents a halogen atom, SR, OR, $SO_2R$ or $NR_2$;

each R''' independently represents a hydrogen atom, an alkyl group, —COOR, —OR, —SR, —$NR_2$ or a halogen atom; R''' can also be a benzofused ring;

$A^-$ represents an anion;

- - - represents an optionally present carbocyclic five- or six-membered ring;

R represents a hydrogen atom, an alkyl or aryl group;

each n can independently be 0, 1, 2 or 3.

If R' represents an alkylsulfonate group, an inner salt can form so that no anion $A^-$ is necessary. If R' represents an alkylammonium group, a second counterion is needed which is the same as or different from $A^-$.

X is preferably a C(alkyl)$_2$ group.

R' is preferably an alkyl group with 1 to 4 carbon atoms.

R" is preferably SR.

R''' is preferably a hydrogen atom.

R is preferably an optionally substituted phenyl group or an optionally substituted heteroaromatic group.

The dotted line preferably represents the residue of a ring with 5 or 6 carbon atoms. The counterion $A^-$ is preferably a chloride ion, trifluoromethylsulfonate or a tosylate anion.

Of the IR dyes of formula (II), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indoliumtosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium-tosylate and 2-[2-[2-chloro-3-[2-ethyl-(3H-benzthiazole-2-ylidene)-ethylidene]-1-cyclohexene-1-yl]-ethenyl]-3-ethyl-benzthiazolium-tosylate.

The following compounds are also IR absorbers suitable for use in the present invention:

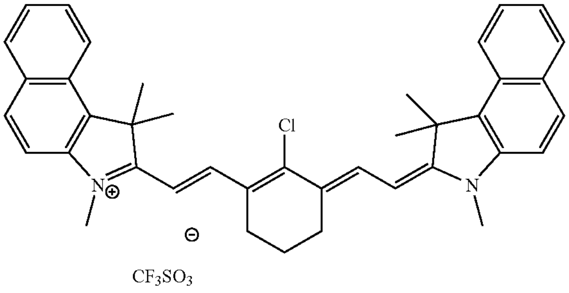

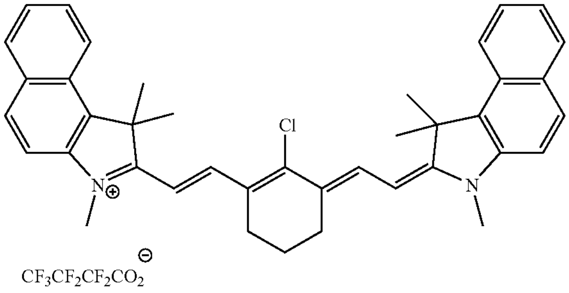

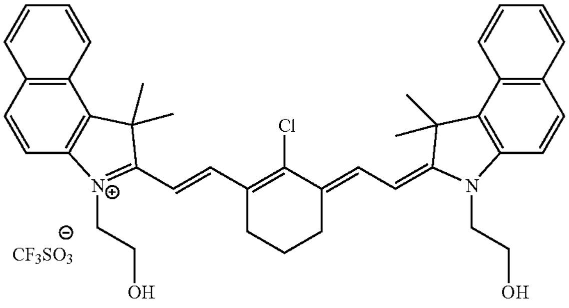

-continued
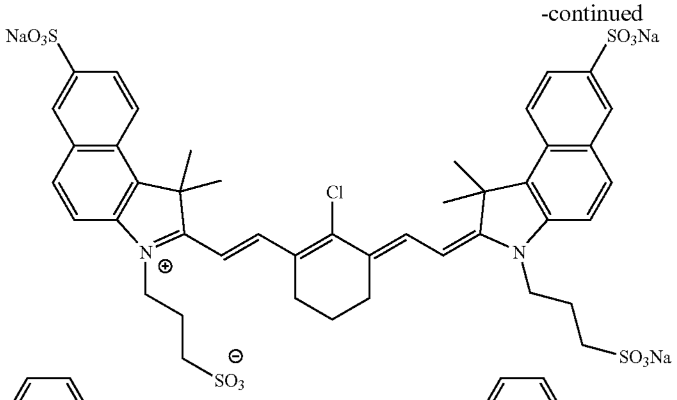
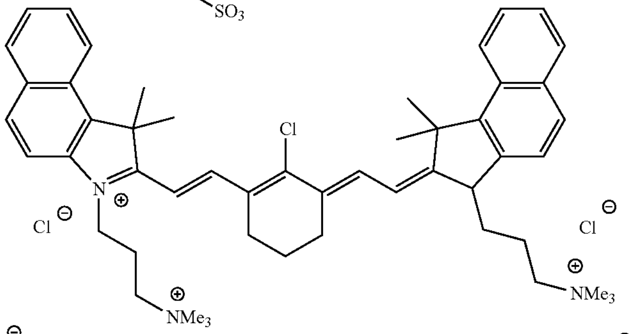
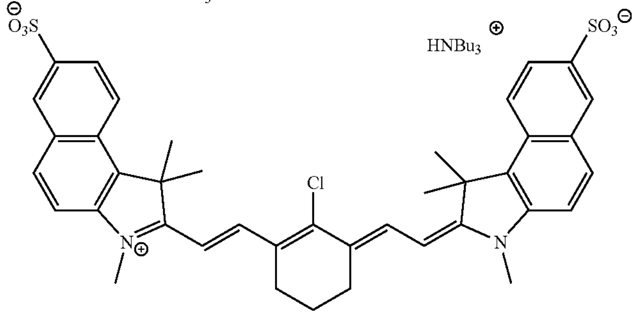
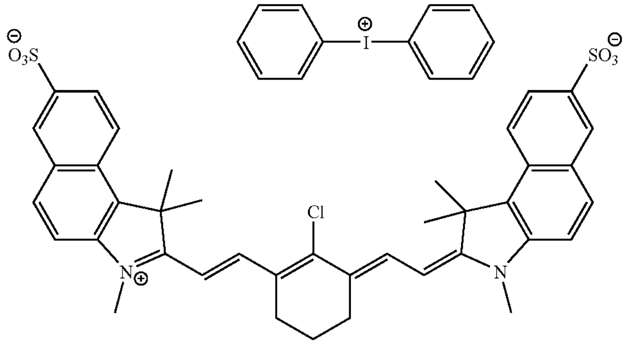
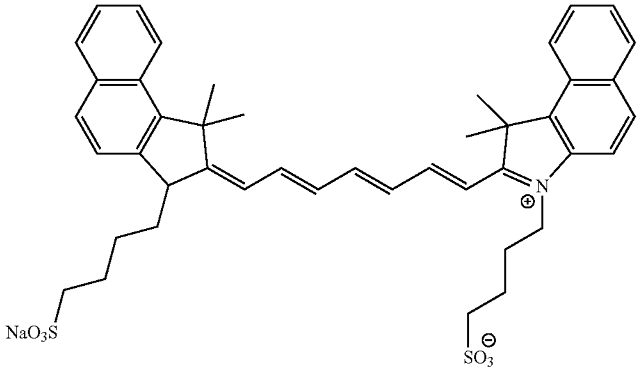

-continued
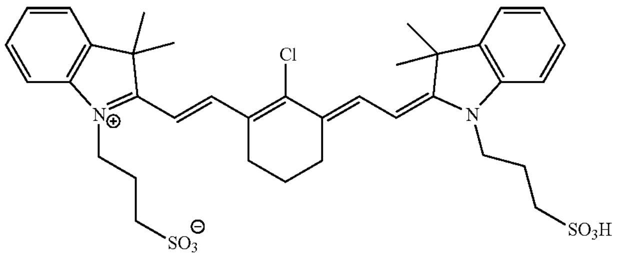
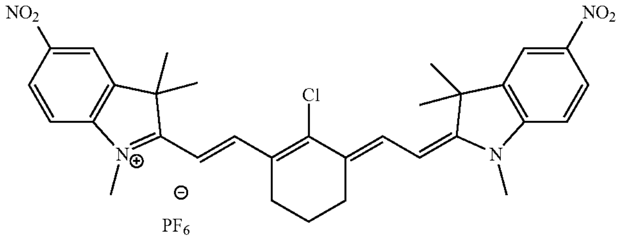
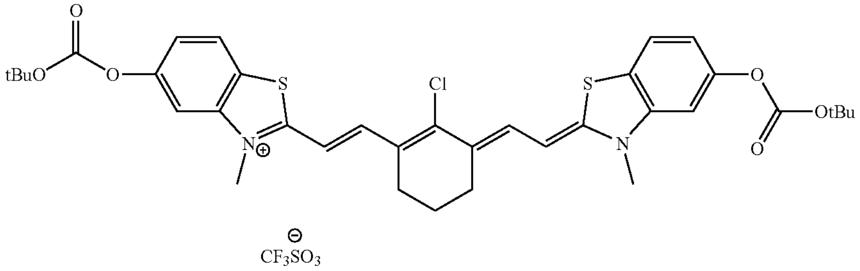
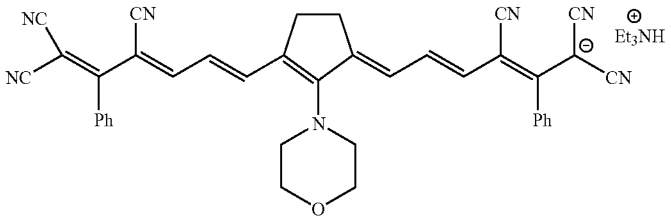
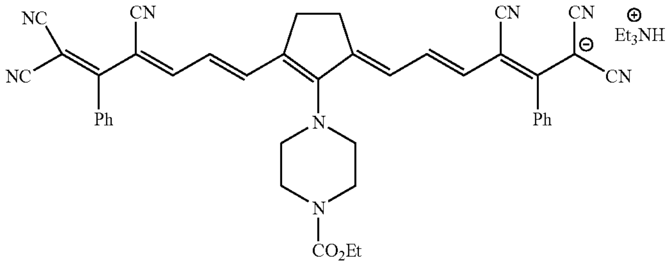
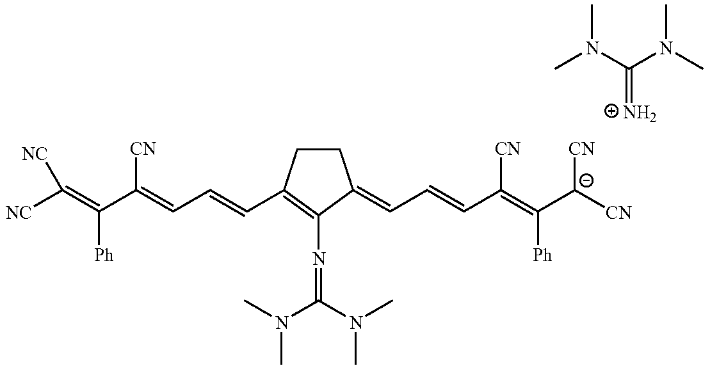

-continued

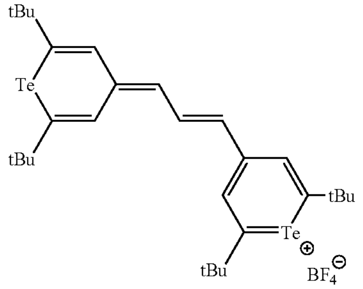

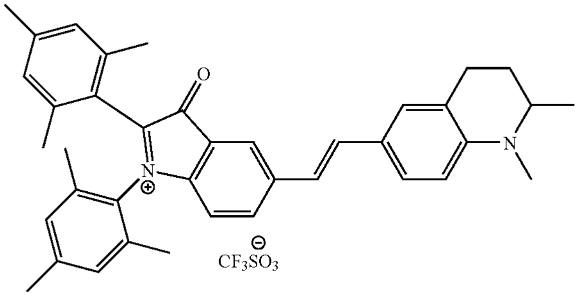

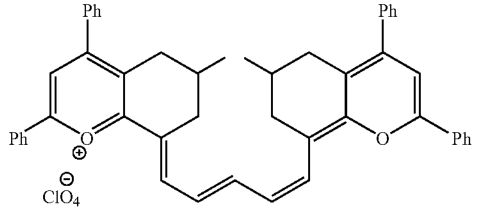

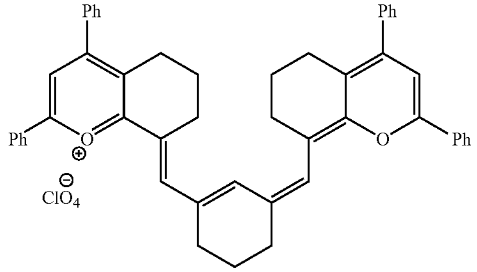

The IR absorber is preferably present in the IR-sensitive composition in an amount of at least 0.1 wt.-%, based on the solids content of the composition, more preferred at least 1 wt.-%, still more preferred at least 2 wt.-%. Usually, the amount of IR absorber does not exceed 25 wt.-%, more preferred 20 wt.-% and most preferred 15 wt.-%. A single IR absorber or a mixture of two or more can be present; in the latter case, the amounts given refer to the total amount of all IR absorbers.

The radical former is another essential component of the initiator system. The radical former is preferably selected from polyhalogenalkyl-substituted compounds, azinium compounds and onium compounds. Polyhalogenalkyl-substituted compounds are especially preferred; those are compounds comprising either one polyhalogenated or several monohalogenated alkyl substituents.

The halogenated alkyl group preferably comprises 1 to 3 carbon atoms; a polyhalogenated methyl group is especially preferred.

The absorption properties of the polyhalogenalkyl-substituted compound largely determine the daylight stability of the IR-sensitive composition. Therefore, if a high degree of daylight stability of the composition is desired, polyhalogenalkyl-substituted compounds not having a UV/VIS absorption maximum at >330 nm are preferred. If compounds are used that have an absorption maximum of >330 nm, these compositions can not only be cured with IR radiation, but also with UV radiation.

Examples of especially suitable polyhalogenalkyl-substituted compounds for use in the compositions according to the present invention include:

Tribromomethylphenylsulfone tribromomethyl-2-pyridylsulfone 1,2,3,4-tetrabromo-n-butane 2-(4-methoxyphenyl)-4,6-bis(trichloromethyl)-s-triazine 2-(4-chlorophenyl)-4,6-bis-(trichloromethyl)-s-triazine 2-phenyl-4,6-bis(trichloromethyl)-s-triazine 2,4,6-tri-(trichloromethyl)-s-triazine 2,4,6-tri-(tribromomethyl)-s-triazine The azinium compounds comprise an azinium core, such as e.g. a pyridinium, diazinium or triazinium core. The azinium core can comprise one or more aromatic rings, preferably carbocyclic aromatic rings fused to the azinium ring. In other words, the azinium cores encompass quinolinium, isoquinolinium, benzodiazinium and naphthodiazinium cores. Monocyclic azinium cores are preferred.

The quaternizing substituent at the nitrogen atom of the azinium ring can be cleaved off as a free radical by means of an electron transfer from the IR absorber to the azinium compound.

An oxy substituent —O—$R^{12}$ is a preferred quaternizing substituent. The oxy substituent can be selected from a number of oxy substituents that are easy to synthesize. The group $R^{12}$ can e.g. be an optionally substituted alkyl group (such as e.g. an aralkyl group or a sulfoalkyl group). The oxy substituents that are especially preferred comprise 1 or 2 carbon atoms.

In the present invention, the term onium compound refers to iodonium, diazonium and sulfonium salts. The residues of such onium compounds are preferably optionally substituted aryl groups with $C_6$ or $C_{10}$ carbon atoms.

Examples of suitable radical formers of the class of azinium and onium salts include the following:

N-Methoxy-4-phenyl-pyridinium-tetrafluoroborate diphenyliodoniumhexafluorophosphate 2-hydroxytetradecyloxyphenyl-phenyliodonium-hexafluoroantimonate 2-methoxy-4-phenylaminobenz-diazonium-hexafluorophosphate Further examples of suitable radical formers include:

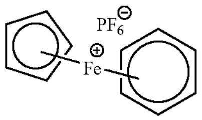

-continued

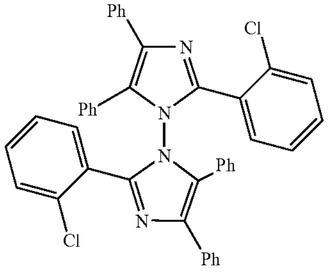

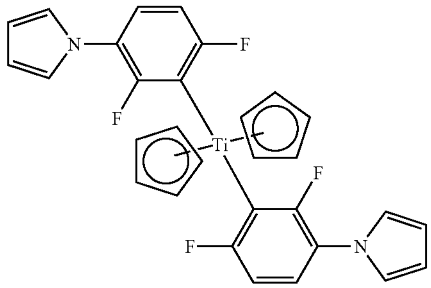

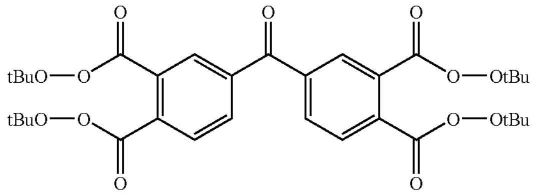

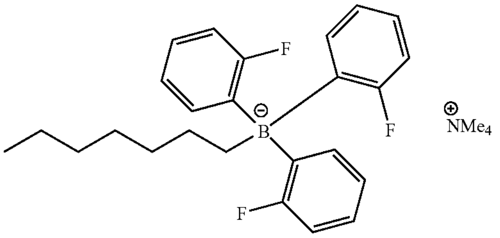

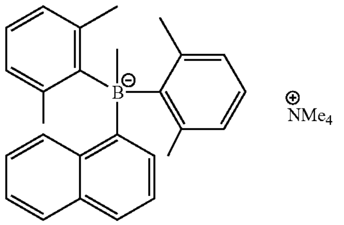

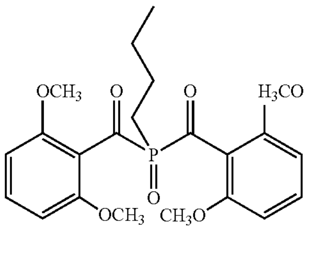

The radical former is preferably present in the IR-sensitive composition in an amount of 2 to 15 wt.-%, based on the total solids content of the IR-sensitive composition, an amount of 4 to 7 wt.-% is especially preferred.

Another essential component is the 1,4-dihydropyridine derivative of the formula (I)

(I)

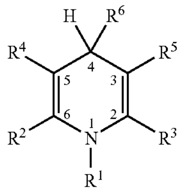

wherein $R^1$ is selected from a hydrogen atom, —C(O)OR$^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)OR$^7$, —C(O)R$^7$, —C(O)NR$^8$R$^9$ and CN, or $R^2$ and $R^4$ together form an optionally substituted phenyl ring or a 5- to 7-membered carbocyclic or heterocyclic ring, wherein the unit

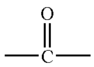

is present in the carbocyclic or heterocyclic ring adjacent to position 5 of the 1,4-dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

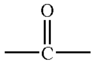

is present in the carbocyclic or heterocyclic rings adjacent to positions 3 and 5 of the dihydropyridine ring and wherein the carbocyclic or heterocyclic rings optionally comprise additional substituents, or one of the pairs $R^2$/$R^4$ and $R^3$/$R^5$ forms a 5- to 7-membered carbocyclic or heterocyclic ring, wherein the unit

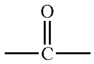

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —NR$^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

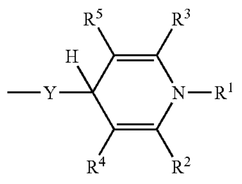

Y is an alkylene group or an arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

According to a preferred embodiment, $R^1$ is a hydrogen atom.

If $R^2$ and $R^3$ do not form rings with adjacent substituents, they are preferably independently selected from $C_1$–$C_5$ alkyl groups or aryl groups.

If $R^4$ and $R^5$ do not form rings with adjacent substituents, they are preferably independently selected from —C(O)OR$^7$.

$R^6$ is preferably selected from $C_1$–$C_5$ alkyl groups or aryl groups.

$R^7$ is preferably selected from $C_1$–$C_5$ alkyl groups and it is especially preferred that it represents a methyl group.

According to one embodiment, the substitution of the 1,4-dihydropyridine ring with $R^2/R^4$ and $R^3/R^5$ is symmetrical, i.e. $R^2{=}R^3$ and $R^4{=}R^5$.

According to a preferred embodiment, $R^2$ and $R^3$ are independently selected from optionally substituted alkyl groups, optionally substituted aryl groups, CN and a hydrogen atom, and $R^4$ and $R^5$ are independently selected from —C(O)OR$^7$, —C(O)R$^7$, —C(O)NR$^8$R$^9$ and CN.

Further suitable coinitiators are 1,4-dihydropyridine derivatives of formula (Ia)

(Ia)

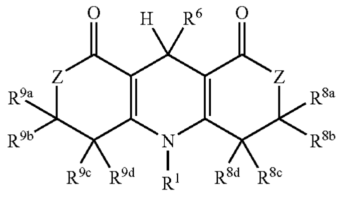

wherein $R^1$ and $R^6$ are as defined above, the groups $R^{8a}$ to $R^{8d}$ and $R^{9a}$ to $R^{9d}$ are independently selected from a hydrogen atom, alkyl groups and aryl groups, wherein two groups $R^9$ and/or two groups $R^8$ of adjacent ring carbon atoms can also form a saturated or unsaturated carbocyclic or heterocyclic ring or fused aromatic ring together, each Z is independently selected from $CR^{13}_2$, O, S and $NR^{13}$ and each $R^{13}$ independently represents a hydrogen atom, alkyl, aralkyl or aryl group, of formula (Ib)

(Ib)

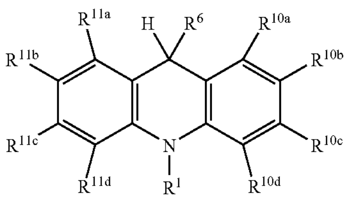

wherein $R^1$ and $R^6$ are as defined above, and $R^{10a}$ to $R^{10d}$ and $R^{11a}$ to $R^{11d}$ are independently selected from a hydrogen atom, alkyl groups, aryl groups, aralkyl groups, halogen atoms (fluorine, chlorine, bromine, iodine), CN, $NR^{13}_2$, C(O)OR$^{13}$ and OR$^{13}$ (each $R^{13}$ independently represents a hydrogen atom, an alkyl group, aryl group or aralkyl group), wherein two groups $R^{11}$ and/or two groups $R^{10}$ of adjacent ring carbon atoms can also form an unsaturated carbocyclic or heterocyclic ring or fused aromatic ring together, of formula (Ic)

(Ic)

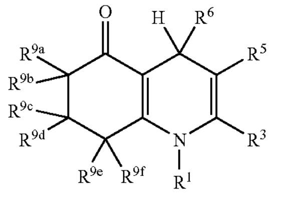

wherein $R^1$, $R^3$, $R^5$ and $R^6$ are as defined above and the groups $R^{9a}$ to $R^{9f}$ are independently selected from a hydrogen atom, alkyl groups, aryl groups, aralkyl groups, halogen atoms (fluorine, chlorine, bromine, iodine), CN, $NR^3_2$, C(O)OR$^{13}$ and OR$^{13}$ ($R^{13}$ independently represents a hydrogen atom, an alkyl group, aryl group or aralkyl group), wherein two groups $R^9$ of adjacent ring carbon atoms can also form a saturated or unsaturated carbocyclic or heterocyclic ring or fused aromatic ring together, of formula (Id)

(Id)

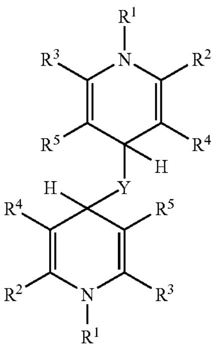

wherein each $R^1$, $R^2$, $R^3$, $R^4$ and $R^5$ independently is as defined above and Y is selected from alkylene and arylene, of formula (Ie)

(Ie)

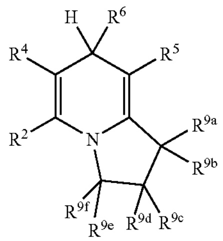

wherein $R^2$, $R^4$, $R^5$ and $R^6$ are as defined above and groups $R^{9a}$ to $R^{9f}$ are defined as are groups $R^{9a}$ to $R^{9d}$ of formula (Ia) above, of formula (If)

(If)

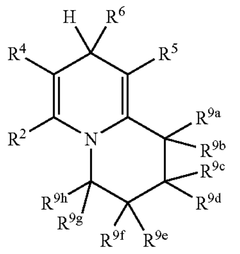

wherein $R^2$, $R^4$, $R^5$ and $R^6$ are as defined above and groups $R^{9a}$ to $R^{9h}$ are defined as are groups $R^{9a}$ to $R^{9d}$ of formula (Ia) above and of formula (Ig)

(Ig)

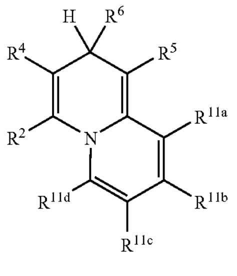

wherein $R^2$, $R^4$, $R^5$ and $R^6$ are as defined above and the groups $R^{11a}$ to $R^{11d}$ are independently selected from a hydrogen atom, alkyl groups, aryl groups, aralkyl groups, halogen atoms (fluorine, chlorine, bromine, iodine), CN, $NR^{13}{}_2$, $C(O)OR^{13}$ and $OR^{13}$ ($R^{13}$ independently represents a hydrogen atom, an alkyl group, aryl group or aralkyl group), wherein two groups $R^{11}$ of adjacent ring carbon atoms can also form an unsaturated carbocyclic or heterocyclic ring or fused aromatic ring together.

It goes without saying that the number of groups $R^8$ or $R^9$ in formulas (Ia), (Ic), (le) and (If) is reduced if two groups $R^8$ or $R^9$ of adjacent ring carbon atoms together form a fused aromatic ring.

In the 1,4-dihydropyridine derivatives of formula (Ia), $R^1$ is preferably a hydrogen atom, $R^6$ is a methyl or phenyl group and Z is preferably O or $CH_2$; the substituents $R^{8a}$ to $R^{8d}$ and $R^{9a}$ to $R^{9d}$ are independently preferably selected from hydrogen atoms and methyl groups. Of the derivatives of formula (Ia) those with symmetrical substitution at the dihydropyridine ring are especially preferred.

In the derivatives of formula (Ib), $R^1$ is preferably a hydrogen atom and $R^6$ is preferably a methyl or phenyl group. The substituents $R^{10a}$ to $R^{10d}$ and $R^{11a}$ to $R^{11d}$ are independently preferably selected from $C_1$–$C_5$ alkyl groups, $OR^{13}$ and halogen atoms; a symmetrical substitution of the two benzene rings is especially preferred.

In the 1,4-dihydropyridine derivatives of formula (Ic), $R^1$ is preferably a hydrogen atom, $R^6$ is preferably a methyl or phenyl group, $R^3$ is preferably a methyl group and $R^5$ is preferably $C(O)OR^7$ (wherein $R^7$ is as defined above). The substituents $R^{9a}$ to $R^{9f}$ are independently preferably selected from $C_1$–$C_5$ alkyl groups. A methyl group is especially preferred.

In the derivatives of formula (Id), Y is preferably a 1,4-phenylene or 1,2-ethylene group. Furthermore, it is preferred that both groups $R^1$ be the same, both groups $R^2$ be the same, both groups $R^3$ be the same, both groups $R^4$ be the same and both groups $R^5$ be the same; the preferred definitions given with respect to formula (I) apply to all groups $R^1$ to $R^5$.

In the derivatives of formula (Ie), $R^2$ is preferably $C_1$–$C_5$ alkyl, $R^4$ is preferably. —$C(O)OR^7$, $R^5$ is preferably $C(O)OR^7$ and $R^6$ is preferably $C_1$–$C_5$ alkyl or phenyl groups ($R^7$ is as defined above). The substituents $R^{9a}$ to $R^{9f}$ are preferably independently selected from $C_1$–$C_5$ alkyl groups.

In the derivatives of formula (If), $R^2$ is preferably $C_1$–$C_5$ alkyl, $R^4$ is preferably $C(O)OR^7$, $R^5$ is preferably $C(O)OR^7$ and $R^6$ is preferably a $C_1$–$C_5$ alkyl or a phenyl group (wherein $R^7$ is as defined above). The substituents $R^{9a}$ to $R^{9h}$ are preferably independently selected from $C_1$–$C_5$ alkyl groups.

In the derivatives of formula (Ig), $R^2$ is preferably $C_1$–$C_5$ alkyl, $R^4$ is preferably $C(O)OR^7$, $R^5$ is preferably $C(O)OR^7$ and $R^6$ is preferably a $C_1$–$C_5$ alkyl or a phenyl group. The substituents $R^{11}$ are preferably independently selected from $C_1$–$C_5$ alkyl groups.

Of the 1,4-dihydropyridine derivatives of formulas (Ia) to (Ig) those of formulas (Ia) and (Id) are especially preferred.

The 1,4-dihydropyridine derivatives used in the present invention can be prepared according to processes well known to the person skilled in the art, such as the Hantzsch synthesis. As an example, reference is made to J. Org. Chem. 30 (1965), p. 1914 et seqq., and *Angew. Chem.* [Applied Chemistry] (Intern.) 20 (1981), p. 762 et seqq.; the processes described therein can also be used for the synthesis of 1,4-dihydropyridines not explicitly disclosed therein by varying the starting compounds accordingly.

In addition to the compounds mentioned above, further compounds can optionally be added to the IR-sensitive compositions of the present invention.

The IR-sensitive composition can furthermore comprise dyes or pigments having a high absorption in the visible spectral range in order to increase contrast. Suitable dyes and pigments are those that dissolve well in the solvent or solvent mixture used for coating or can be easily introduced in disperse form. Suitable contrast dyes include inter alia rhodamine dyes, triarylmethane dyes such as Victoria blue R and Victoria blue B0, crystal violet and methyl violet, anthraquinone pigments, azo pigments and phthalocyanine dyes and/or pigments. The dyes are preferably present in the IR-sensitive composition in an amount of from 0.5 to 15 wt.-%, especially preferred in an amount of from 1.5 to 7 wt.-%, based on the solids content of the IR-sensitive composition.

The IR-sensitive compositions of the present invention can furthermore comprise plasticizers. Suitable plasticizers include inter alla dibutyl phthalate, triaryl phosphate, dioctyl phthalate, didodecyl phthalate, dibutyl sebacate, glycerol triacetate and mixtures thereof. If a plasticizer is used, its amount preferably accounts for 0.25 to 2 wt.-%.

Furthermore, the IR-sensitive composition can comprise surfactants (e.g. anionic, cationic, amphoteric or non-ionic tensides or mixtures thereof). Suitable examples include siloxane-containing polymers, fluorine-containing polymers, polymers with ethylene oxide and/or propylene oxide groups, sorbitol-tri-stearate and alkyl-di-(aminoethyl)-glycines. They are preferably present in an amount of 0 to 10 wt.-%, based on the solid content of the IR-sensitive composition, especially preferred 0.2 to 5 wt.-%.

Further optional components of the radiation-sensitive composition include e.g. inorganic fillers such as e.g. $Al_2O_3$ and $SiO_2$ (they are preferably present in an amount of 0 to 20 wt.-%, based on the solids content, especially preferred 0.1 to 5 wt.-%).

Furthermore, the radiation-sensitive composition can comprise leuco dyes such as e.g. leuco crystal violet and leucomalachite green. They are preferably present in an amount of 0 to 10 wt.-%, based on the solids content, especially preferred 0.5 to 5 wt.-%.

The radiation-sensitive composition can furthermore comprise known chain transfer agents such as e.g. 2-mercaptobenzimidazole, 2-mercaptobenzthiazole, 2-mercaptobenzoxazole and 3-mercapto-1,2,4-triazole. They are preferably used in an amount of 0 to 15 wt.-%, based on the solids content, especially preferred 0.5 to 5 wt.-%.

The IR-sensitive compositions of the present invention can be used for the production of printing plates. However, they can also be used as resists for the production of printed circuit boards for integrated circuits or photomasks, for the production of reliefs to be used as printing forms, screens and the like, as radiation-hardenable varnishes for surface protection and for the formulation of radiation-hardenable printing inks.

A dimensionally stable plate or foil-shaped material is preferably used as a substrate in the production of printing plate precursors. Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability; is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte, and optionally anodizing.

Furthermore, in order to improve the hydrophilic properties of the surface of the metal substrate that has been grained and optionally anodized in sulfuric acid or phosphoric acid, the metal substrate can be subjected to an aftertreatment with an aqueous solution of e.g. sodium silicate, calcium zirconium fluoride, polyvinyl phosphonic acid or phosphoric acid. Within the framework of the present invention, the term "substrate" also encompasses an optionally pretreated substrate exhibiting, for example, a hydrophilizing layer on its surface.

The details of the above-mentioned substrate pretreatment are known to the person skilled in the art.

The IR-sensitive layer is applied onto the optionally pretreated substrate from a solution of all components in an organic solvent or solvent mixture (e.g. alcohols such as methanol, n- and iso-propanol, n- and iso-butanol; ketones such as methyl ethyl ketone, methyl propyl ketone, cyclohexanone; multifunctional alcohols and derivatives thereof, such as ethylene glycol monomethyl ether and monoethyl ether, propylene glycol monomethyl ether and monoethyl ether; esters such as methyl lactate and ethyl lactate) and dried. This can be carried out by means of common coating methods such as coating with doctor blades, spin coating, and the like.

The dry layer weight of the IR-sensitive layer in lithographic printing plate precursors is preferably 0.5 to 4.0 $g/m^2$, especially preferred 1 to 3 $g/m^2$.

A water-soluble oxygen-impermeable overcoat, as it is known in the art, can be applied on top of the layer of IR-sensitive compositions, e.g. a layer of polyvinyl alcohol, polyvinyl alcohol/polyvinyl acetate copolymers, polyvinyl pyrrolidon, polyvinyl pyrrolidon/polyvinyl acetate copolymers, polyvinyl methylether, ring-opened copolymers of maleic acid anhydride and a comonomer, such as methylvinyl ether, cellulose ether, polyacrylic acid and gelatine; polyvinyl alcohol is preferred. The dry layer weight of the oxygen-impermeable layer is preferably 0.1 to 6 $g/m^2$, more preferably 0.3 to 4 $g/m^2$. However, the printing plate precursors according to the present invention show excellent properties even without an overcoat. The overcoat can also comprise matting agents (i.e. organic or inorganic particles with a particle size of 2 to 20 μm). In order to improve adhesion of the overcoat to the radiation-sensitive layer, the overcoat can comprise adhesion promoters such as e.g. poly(vinylpyrrolidone), poly(ethyleneimine) and poly(vinylimidazole).

Suitable overcoats are described for example in WO 99/06890.

The thus obtained printing plates are exposed with semiconductor lasers or laser diodes which emit in the range of 750 to 1,300 nm. Such a laser beam can be digitally controlled via a computer, i.e. it can be turned on or off so that an image-wise exposure of the plates can be effected via stored digitalized information in the computer. The IR-sensitive compositions of the present invention are therefore suitable for creating so-called computer-to-plate (ctp) printing plates. All image-setting units with IR lasers known to the person skilled in the art can be used for this purpose.

The image-wise exposed elements such as printing plate precursors are developed with an aqueous alkaline developer, which usually has a pH value in the range of 6 to 12. For this purpose, commercially available developers can be used.

The developed printing plates can additionally be subjected to a "baking" step in order to increase the abrasion resistance of the printing areas; however, this is not necessarily required for the printing plates of the present invention.

The invention will be explained in more detail in the following examples.

EXAMPLES

Preparation Example 1

General Process for Preparing 1,4-dihydro-2,6-dimethyl-3,5-di(methoxycarbonyl)pyridines Substituted in the 4-Position 0.2 moles methylacetoacetate (available from Aldrich), 0.1 moles of the aldehyde corresponding to the 4-substituent and 0.11 moles ammonium acetate were dissolved in 30 ml methanol. This mixture was refluxed for 3 hours. The precipitation formed after cooling was filtered off and dried in a vacuum oven for one day at 40° C. The products were then recrystallized in solvents or solvent mixtures (as listed in Table 1). The 1,4-dihydropyridine structure was confirmed by UV spectra recorded in methanol (absorption wavelength λ and extinction coefficient ϵ, see Table 1).

TABLE 1

| Substituent in 4-position | Solvent for recrystallization | Melting point [° C.] | λ [nm] ϵ [l/g × cm] |
|---|---|---|---|
| ethyl | methanol/water (6/4) | 146–148 | 348 30.2 |
| phenyl | ethanol/water (2/1) | 190–192 | 352 23.1 |
| 4-N,N-dimethyl-amino-phenyl | i-propanol | 200–201 | 348 26.1 |

Preparation Example 2

1,4-Dihydro-1-methyl-2,6-dimethyl-3,5-di(methoxycarbonyl)-4-phenylpyridine 10.6 g benzaldehyde, 8 g methylamine (40% in water, available from Aldrich), 23.2 g methylacetoacetate (available from Aldrich) and 2 g acetic acid were dissolved in 25 ml methanol. This mixture was refluxed for 2 hours. After cooling, a precipitation formed that was filtered off, recrystallized in methanol and dried in a vacuum oven for one day at 40° C. Yield: 23.4 g (75.2%); melting point: 151–153° C.; λ=354 nm; ϵ=22.6 l/g×cm.

Preparation Example 3

3,3',6,6'-Tetramethyl-9-phenyl-1,2,3,4,5,6,7,8,9,10-decahydroacridine-1,8-dione 5.3 g benzaldehyde, 14 g 5,5-dimethyl-1,3-cyclohexanedione (available from Aldrich) and 4.5 g ammonium acetate were dissolved in 35 ml methanol. This mixture was refluxed for 5 hours. The precipitation formed after cooling was filtered off, recrystallized in methanol and dried in a vacuum oven for one day at 40° C. Yield: 13.4 g (77%); melting point: 275–277° C.; λ375 nm; ϵ=25.4 l/g×cm.

Example 1

A coating solution was prepared from the following components:

6.4 g JONCRYL® 683 (acrylic acid copolymer of the company SC Johnson, USA; acid number=175 mg KOH/g)

8.0 g AC 50 (methacrylic acid copolymer of the company PCAS, France; acid number=48 mg KOH/g; 70 wt.-% solution in ethylene glycol monomethyl ether)

2.6 g dipentaerythritol pentaacrylate 16.8 g urethane acrylate (80% solution in methyl ethyl ketone; prepared by reacting Desmodur® N100 of the company Bayer with hydroxyethyl acrylate and pentaerythritol triacrylate; amount of double bonds: 0.5 double bonds per 100 g, when all isocyanate groups have reacted)

1.15 g 1,4-dihydro-2,6-dimethyl-3,5-di(methoxycarbonyl)-4-phenylpyridine 0.3 g 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride 1.5 g 2-(4-methoxyphenyl)-4,6-bis(trichloromethyl)-1,3,5-triazine and 0.6 g BASONYL VIOLET 610 (Basic Violet 3, C.I. 42555; available from Bayer, Germany)

The components listed above were dissolved under stirring in 200 ml of a mixture consisting of 90 parts by volume 1-methoxy-2-propanol and 10 parts by volume acetone After filtration of the solution, it was applied by means of common processes to an electrochemically roughened and anodized aluminum foil that had been subjected to an aftertreatment with an aqueous solution of polyvinylphosphonic acid and the layer was dried for 4 minutes at 90° C. The dry weight of the resulting IR-sensitive layer was about 1.9 g/m$^2$.

Then an oxygen-impermeable layer with a dry layer weight of 2.1 g/m$^2$ was applied by coating with a solution of the following composition:

42.5 g AIRVOL 203 (polyvinyl alcohol of the company Airproducts, USA; 12 wt.-% residual acetyl groups)

7.5 g polyvinyl imidazole (available from Panchim, France) and 170 g water

Drying took place for 5 minutes at 90° C.

All plate precursors produced in this manner will be referred to as "fresh" plate precursors in the following.

The plate precursor produced in this manner was then exposed in a Trendsetter 3244 of the company Creo/Scitex with an 830 nm laser diode (20 W head, 6.5 W, different drum speeds). An UGRA/FOGRA Postscript 2.0 EPS, which contains different elements for evaluating the quality of the copies, was used for imaging.

The exposed precursor was processed in a MercuryNews processor (Kodak Polychrome Graphics LLC) equipped with a preheating section, a pre-wash section, an immersion type developing bath, a section for rinsing with water, a gumming and a drying section. The processor was filled with developer 981 from Kodak Polychrome Graphics LLC. The following parameters were applied for processing the plate precursor: speed 120 cm/min, preheating 630, pre-wash volume 0.5 l/m$^2$ plate, temperature of the developing bath 23±1° C. After this treatment, the exposed areas remained on the plate while the unexposed areas were completely removed by the developer.

The following criteria were used for evaluating the copies obtained after heating and developing: The reproduction quality of 1 pixel elements, the optical density of checkerboard patterns of the pixel elements and the optical density of a solid region. For determining the contrast and the density of solids and screen dots, a D19/D 196 densitometer (Gretag/Macbeth Color Data Systems, Great Britain) was used.

The results with respect to energy requirements showed that an exposure energy of 70 $mJ/cm^2$ was sufficient for a good reproduction of solids on a fresh plate, while an energy of 95 $mJ/cm^2$ was required for 1 pixel elements. The plate exposed with 95 $mJ/cm^2$ was mounted in a sheet-fed offset press and used for printing. The image areas accepted the printing ink without any problems and the paper copies did not show any toning in the non-image areas. After 130,000 high-quality copies, printing was discontinued; however, the plate could have been used for more prints.

In order to examine the storage stability of the plate, it was subjected to a rapid test of simulated ageing. For this purpose, the printing plate precursors were either heated to 60° C. in an incubator for 15 hours (in the following referred to as "dry-aged" plate precursor) or stored in a climatic chamber for 7 days at a temperature of 40° C. and a relative humidity of 80% (in the following referred to as "wet-aged" precursor). Then the IR sensitivity and printing results of these precursors were determined as described above. The unexposed areas of both types of aged precursors could be removed completely with the developer. The results regarding the energy requirements showed that an exposure energy of 105 $mJ/cm^2$ was necessary for a good reproduction of solids in the case of dry-aged precursors, and 114 $mJ/cm^2$ in the case of wet-aged precursors. A good reproduction of 1 pixel elements required 133 $mJ/cm^2$ (dry-aged) and 150 $mJ/cm^2$ (wet-aged), respectively.

Plates produced from wet-aged and dry-aged precursors and exposed with the corresponding exposure energy were mounted in a sheet-fed offset press and used for printing. The image areas accepted the printing ink without any problems and the paper copies did not show any toning in the non-image areas. After 130,000 high-quality copies, printing was discontinued; however, both plates could have been used for more prints.

Example 2

The coating solution of Example 1 was modified by replacing 1.5 g 1,4-dihydro-2,6-dimethyl-3,5-di(methoxycarbonyl)-4-phenylpyridine with 1.26 g 1,4-dihydro-2,6-dimethyl-3,5-di(methoxycarbonyl)-4-ethylpyridine. The coating composition was applied as described in Example 1, exposed and developed. The following exposure energy was required for a good reproduction:

66 $mJ/cm^2$ for solids of a fresh plate precursor
94 $mJ/cm^2$ for 1 pixel elements of a fresh plate precursor
106 $mJ/cm^2$ for solids of a dry-aged precursor
136 $mJ/cm^2$ for 1 pixel elements of a dry-aged precursor
110 $mJ/cm^2$ for solids of a wet-aged precursor and
145 $mJ/cm^2$ for 1 pixel elements of a wet-aged precursor.

A fresh plate precursor which was exposed with 94 $mJ/cm^2$ and then developed was mounted in a sheet-fed offset press and used for printing. The image areas accepted the printing ink without any problems and the paper copies did not show any toning in the non-image areas. After 130,000 high-quality copies, printing was discontinued; however, the plate could have been used for more prints.

In order to assess the sensitivity to yellow light, a piece of a fresh precursor was exposed with a yellow light source (Encapsulate G10) with an intensity of 1380 lux (measured with a Lutron LX-17 illuminometer) for time intervals between 1 and 15 minutes. Then half of the precursor was exposed with a 50% screen on a Trendsetter 3244 (exposure conditions: 8 W, 180 revolutions/minute, 108 $mJ/cm^2$). Subsequently, developing was carried out as described in Example 1 and the increase in screen dots and fogging in the background areas were measured with an X-Rite 508 Densitometer (Yule-Nielsen coefficient=1.12). It was found that during the tested time interval no background was detected in the unexposed areas after developing and that the screen number of 50 remained constant. These results show that under those light conditions the plate precursor is not sensitive to yellow light.

Example 3

The coating solution of Example 1 was modified by replacing 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride with 0.3 g IRT dye (available from Showa Denko K.K., Japan), which is a polymethine dye, and by replacing 1.5 g 1,4-dihydro-2,2-dimethyl-3,5-di(methoxycarbonyl)$_4$-phenylpyridine with 1.85 g 1,4-dihydro-2,6-dimethyl-3,5-di(methoxycarbonyl)-4-(4-diethylaminophenyl)pyridine. The resulting composition was applied as described in Example 1, then exposed and developed. The following exposure energy was required for a good reproduction:

69 $mJ/cm^2$ for solids of a fresh plate precursor
99 $mJ/cm^2$ for 1 pixel elements of a fresh plate precursor
106 $mJ/cm^2$ for solids of a dry-aged precursor
139 $mJ/cm^2$ for 1 pixel elements of a dry-aged precursor
114 $mJ/cm^2$ for solids of a wet-aged precursor and
145 $mJ/cm^2$ for 1 pixel elements of a wet-aged precursor.

Example 4

Example 1 was repeated using the following coating composition:

2.5 g SCRIPSET® 540 (butyl semi-ester of maleic acid anhydride/styrene copolymer; available from Solutia, USA)
0.55 g dipentaerythritol pentaacrylate
3.4 g urethane acrylate (80% solution in methyl ethyl ketone; prepared by reacting Desmodur® N100 of the company Bayer with hydroxyethyl acrylate and pentaerythritol triacrylate; amount of double bonds: 0.5 double bonds per 100 g, when all isocyanate groups have reacted)
0.3 g 3,3',6,6'-tetramethyl-9-phenyl-1,2,3,4,5,6,7,8,9,10-decahydroacridine-1,8-dione
0.32 g 2-[2-[2-chloro-3-[2-ethyl-(3H-benzthiazole)-2-ylidene]-1-cyclohexene-1-yl]-ethenyl]-3-ethyl-benzthiazoliumtosylate and
0.32 g tribromomethylphenylsulfone The results with respect to energy requirements showed that an exposure energy of 133 $mJ/cm^2$ was sufficient for a good reproduction of solids and 152 $mJ/cm^2$ for a good reproduction of 1 pixel elements on a fresh plate. A good reproduction of solids on a dry-aged precursor required 152 $mJ/cm^2$, while a wet-aged precursor required 177 $mJ/cm^2$. A good reproduction of 1 pixel elements on a dry-aged precursor required 168 $mJ/cm^2$, while a wet-aged precursor required 188 $mJ/cm^2$. The results show that a modification of the 1,4-dihydropyridine unit, the IR dye, the polyhalogenalkyl compound and the polymeric binder only had a negligible effect on the sensitivity parameters of fresh and aged precursors.

Example 5

A coating solution was prepared from the following components:

2.5 g allylmethacrylate/methacrylic acid copolymer (80/20 wt.-%, prepared as described in U.S. Pat. No. 4,511,645)
0.65 g dipentaerythritol pentaacrylate
4.0 g urethane acrylate (80% solution in methyl ethyl ketone; prepared by reacting Desmodur® N100 of the company Bayer with hydroxyethyl acrylate and pentaerythritol triacrylate; amount of double bonds: 0.5 double bonds per 100 g, when all isocyanate groups have reacted)
1.2 g 1,4-dihydro-2,6-dimethyl-3,5-(methoxycarbonyl)-4-phenylpyridine
0.45 g 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]indolium 4-methylbenzolsulfonate
1.5 g 2-(4-methoxyphenyl)-4,6-bis(trichloromethyl)-1,3,5-triazine and
0.6 g BASONYL VIOLET 610

The resulting composition was applied as described in Example 1, exposed and developed. The following exposure energy was required for a good reproduction of solids and 1 pixel elements:

64 mJ/cm$^2$ for solids of a fresh plate precursor
88 mJ/cm$^2$ for 1 pixel elements of a fresh plate precursor
102 mJ/cm$^2$ for solids of a dry-aged precursor
127 mJ/cm$^2$ for 1 pixel elements of a dry-aged precursor
110 mJ/cm$^2$ for solids of a wet-aged precursor and
140 mJ/cm$^2$ for 1 pixel elements of a wet-aged precursor.

A fresh plate precursor prepared as described above was processed in the MercuryNew processor after IR exposure in a Trendsetter 3244 without the use of the preheating and pre-wash sections. A good reproduction of solids required 105 mJ/cm$^2$ and a reproduction of 1 pixel elements required 125 mJ/cm$^2$.

Example 6

The coating composition of Example 1 was modified by additionally adding 0.7 g 3-mercapto-1,2,4-triazole. The resulting composition was applied as described in Example 1, exposed and developed. The following exposure energy was required for a good reproduction of solids and 1 pixel elements:

70 mJ/cm$^2$ for solids of a fresh plate precursor
95 mJ/cm$^2$ for 1 pixel elements of a fresh plate precursor
95 mJ/cm$^2$ for solids of a dry-aged precursor
122 mJ/cm$^2$ for 1 pixel elements of a dry-aged precursor
106 mJ/cm$^2$ for solids of a wet-aged precursor and
131 mJ/cm$^2$ for 1 pixel elements of a wet-aged precursor These results show that the addition of 3-mercapto-1,2,4-triazole to the composition leads to coatings exhibiting the same degree of sensitivity as fresh precursors without mercaptotriazole, however, exhibiting a superior stability when stored at elevated temperatures and/or higher humidity.

The sensitivity to yellow light was examined as described in Example 2. It was found that during the tested time interval no background was detected after developing and that the screen number of 50% remained constant.

Comparative Example 1

Example 1 was repeated without the addition of 1,4-dihydro-2,6-dimethyl-3,5-di(methoxycarbonyl)-4-phenylpyridine, and the resulting composition was applied as described in Example 1, exposed and developed. A minimum exposure energy of about 320 mJ/cm$^2$ was necessary to achieve a maximum density of solids. This result indicates that the absence of 1,4-dihydropyridine leads to a lower sensitivity than shown by the compositions of the present invention.

Comparative Example 2

Example 1 was repeated, but no triazine was added to the composition. The resulting composition was applied as described in Example 1, exposed and developed. Up to an exposure energy of 450 mJ/cm$^2$ no cured coating remained on the substrate. This shows that the absence of polyhalogenated s-triazine results in an IR-insensitive coating.

Example 7

Example 1 was repeated with the exception that 1,4-dihydro-1,2,6-trimethyl-3,5-di(methoxycarbonyl)$_4$-phenylpyridine was used instead of 1,4-dihydro-2,6-dimethyl-3,5-di(methoxycarbonyl)-4-phenylpyridine. An energy of about 250 mJ/cm$^2$ was necessary to achieve maximum density.

The 1,4-dihydropyridines used in the present invention not only lead to an increased sensitivity and storage stability but are also characterized in that they can be prepared easily and inexpensively in a "one-pot reaction", which is a further advantage of the present invention.

The invention claimed is:

1. An initiator system comprising:

(a) at least one substance capable of absorbing IR radiation,
(b) at least one compound capable of forming free radicals, and
(c) at least one 1,4-dihydropyridine derivative of the formula (I)

(I)

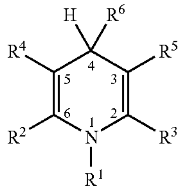

wherein $R^1$ is selected from a hydrogen atom, —C(O)OR$^7$, an optionally substituted alkyl group, an optionally substituted aryl group and an optionally substituted aralkyl group,
$R^2$ and $R^3$ are independently selected from optionally substituted alkyl groups, optionally substituted aryl groups. CN and a hydrogen atom, $R^4$ and $R^5$ are independently selected from —C(O)OR$^7$, —C(O)R$^7$, —C(O)NR$^8$R$^9$ and CN,
or $R^2$ and $R^4$ together form an optionally substituted phenyl ring or a 5- to 7-membered carbocyclic or heterocyclic ring, wherein the unit

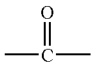

is present in the carbocyclic or heterocyclic ring adjacent to position 5 of the dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

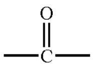

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

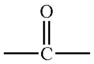

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, $—NR^{13}$ groups, —S— or —O—, $R^6$ is selected from an alkyl group optionally substituted with a halogen atom or a —C(O) group, an optionally substituted aryl group, an optionally substituted aralkyl group, an optionally substituted heterocyclic group and the group

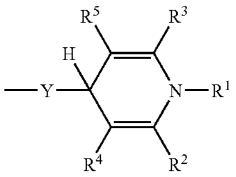

Y is an alkylene group or an arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

2. The initiator system according to claim 1, wherein component (a) is a cyanine dye.

3. The initiator system according to claim 1 wherein the at least one substance capable of absorbing IR radiation is an IR dye of the formula II (II)

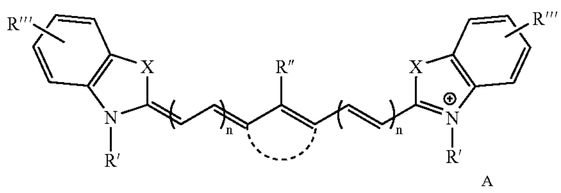

wherein each X independently represents S, O, NR or $C(alkyl)_2$;

each R' independently represents an alkyl group, an alkylsulfonate group or an alkylammonium group;

R" represents a halogen atom, SR, OR or $NR_2$;

each R''' independently represents a hydrogen atom, an alkyl group, —COOR, —OR, —SR, $—NR_2$ or a halogen atom; R''' can also be a benzofused ring;

$A^-$ represents an anion,

--- represents an optionally present carbocyclic five- or six-membered ring;

R represents a hydrogen atom, an alkyl or aryl group;

each n can independently be 0, 1, 2 or 3.

4. The initiator system according to claim 1 wherein the IR absorber is

2-[2-[2-thiophenyl-3-[2-(1,3-dihydro- 1,3,3-trimethyl-2H-indole-2-ylidene)-ethylidene]-1-cyclohexene-1-yl]-ethenyl]-1,3,3-trimethyl-3H-indoliumchloride, 2-[2-[2-chloro-3-[2-(1,3-dihydro-1,3,3-trimethyl-2H-indole-2-ylidene)-ethylidene]-1-cyclohexene-1-yl]-ethenyl]-1,3,3-trimethyl-3H-indolium-tosylate or 2-[2-[2-chloro-3-[2-ethyl-3H-benz-thiazole-2-ylidene)-ethylidene]-1-cyclohexene-1-yl]-ethenyl]-3-ethyl-benzthiazolium-tosylate.

5. The initiator system according to claim 1 wherein component (b) is a polyhalogenalkyl-substituted compound.

6. The initiator system according to claim 1 wherein component (b) is 2-phenyl-4,6-bis-(trichloromethyl)-s-triazine, 2-(4-methoxyphenyl)-4,6-bis(chloromethyl)-s-triazine, tribromomethyiphenylsulfone or 2,4,6-tri-(trichloromethyl)-s-triazine.

7. The initiator system according to claim 1 wherein a 1,4-dihydropyridine derivative of formula (I) is used wherein $R^1$ is a hydrogen atom.

8. The initiator system according to claim 1 wherein a derivative with $R^2═R^3$ and $R^4═R^5$ is used.

9. The initiator system according to claim 1 wherein $R^2$ and $R^3$ are independently selected from optionally substituted alkyl groups, optionally substituted aryl groups, CN and a hydrogen atom, and $R^4$ and $R^5$ are independently selected from $—C(O)OR^7$, $—C(O)R^7$, $—C(O)NR^8R^9$ and CN, arid $R^7$, $R^8$ and $R^9$ are as defined in claim 1.

10. The initiator system according to claim 1 wherein the 1,4-dihydropyridine derivative is a compound of formula (Ia)

(Ia)

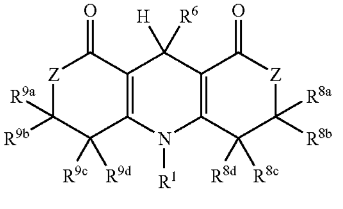

wherein $R^1$ and $R^6$ are as defined above, the groups $R^{8a}$ to $R^{8d}$ and $R^{9a}$ to $R^{9d}$ are independently selected from a hydrogen atom, alkyl groups and aryl groups, wherein two groups $R^8$ and/or two groups $R^9$ of adjacent ring carbon atoms can also form a saturated or unsaturated carbocyclic or heterocyclic ring or fused aromatic ring together, each Z is independently selected from $CR^{13}_2$, O, S and $NR^{13}$ and each $R^{13}$ independently represents a hydrogen atom, alkyl, aryl or aralkyl group, of formula (Ib)

(Ib)

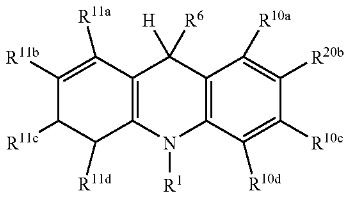

wherein $R^1$ and $R^6$ are as defined above, and $R^{10a}$ to $R^{10d}$ and $R^{11a}$ to $R^{11d}$ are independently selected from a hydrogen atom, alkyl groups, aryJ groups, aralkyl groups, halogen atoms, CN, $NR^{13}_2$, $C(O)OR^{13}$ and $OR^{13}$, wherein each $R^{13}$ is independently selected from a hydrogen atom, aryl, alkyl or aralkyl, wherein two groups $R^{11}$ and/or two groups $R^{10}$ of adjacent ring carbon atoms can also form an unsaturated carbocyclic or heterocyclic ring or fused aromatic ring together, of formula (Ic)

(Ic)

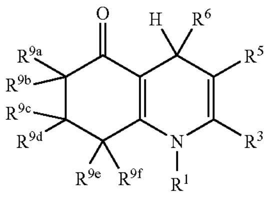

wherein $R^1$, $R^3$, $R^5$ and $R^6$ are as defined above and the groups $R^{9a}$ to $R^{9f}$ are defined as are groups $R^{9a}$ to $R^{9d}$ of formula (Ia), of formula (Id)

(Id)

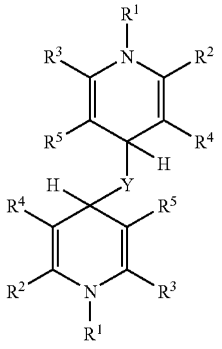

wherein each $R^1$, $R^2$, $R^3$, $R^4$ and $R^5$ independently is as defined above and Y is selected from alkylene and arylene, of formula (Ie)

(Ie)

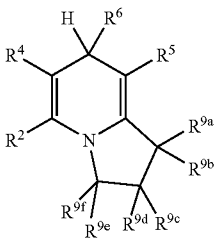

wherein $R^2$, $R^4$, $R^5$ and $R^6$ are as defined above and groups $R^{9a}$ to $R^{9f}$ are as defined above for formula (Ic), of formula (If)

(If)

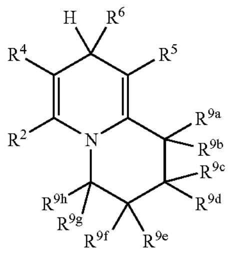

wherein $R^2$, $R^4$, $R^5$ and $R^6$ are as defined above and groups $R^{9a}$ to $R^{9h}$ are defined as are groups $R^{9a}$ to $R^{9d}$ of formula (Ia) above or of formula (Ig)

(Ig)

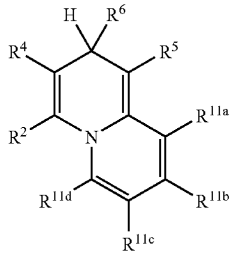

wherein $R^2$, $R^4$, $R^5$ and $R^6$ are as defined above and the groups $R^{11a}$ to $R^{11d}$ are independently selected from a hydrogen atom, alkyl groups, aryl groups, aralkyl groups, halogen atoms, CN, $NR^{13}_2$, $C(O)OR^{13}$ and $OR^{13}$, wherein two groups $R^{11}$ of adjacent ring carbon atoms can also form an unsaturated carbocyclic or heterocyclic ring or fused aromatic ring together and each $R^{13}$ is independently selected from hydrogen, alkyl, aryl and aralkyl.

11. An IR-sensitive composition comprising:

(i) a free-radical polymerizabie system comprising unsaturated monomers or prepolymers that are free-radical polymerizable and an initiator system according to claim 1 and (ii) a polymeric binder.

12. The composition according to claim 11, additionally comprising at least one additive selected from contrast dyes, exposure indicators, plasticizers, surfactant, leuco dyes and mercapto compounds.

13. The composition according to claim 11 wherein the polymeric binder has an acid number of >40 mg KOH/g.

14. An imageable element comprising a substrate and a coating with the composition of claim 11 and optionally an oxygen-impermeable overcoat.

15. The imageable element according to claim 14 wherein the substrate is an optionally pretreated aluminum plate or foil.

16. The imageable element according to claim 14 that is a printing plate precursor.

17. A process for the production of an imageable element comprising:

(a) providing an optionally pretreated substrate, (b) providing the IR-sensitive composition of claim 11, (c) applying the IR-sensitive composition onto the substrate and optionally (d) applying an oxygen-impermeable overcoat.

18. A process for imaging an imageable element comprising:

(a) providing the imageable element of claim 14, (b) image-wise exposure of the imageable element to radiation of a wavelength selected from the range of 750 to 1,300 nm, and (c) removing the unexposed areas of the exposed element by means of an aqueous alkaline developer.

* * * * *